(12) United States Patent
Kang

(10) Patent No.: US 8,848,749 B2
(45) Date of Patent: Sep. 30, 2014

(54) LIGHT RADIATING DEVICE AND METHOD OF FABRICATING ORGANIC LIGHT EMITTING DIODE DISPLAY DEVICE USING THE SAME

(75) Inventor: Tae-Wook Kang, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 796 days.

(21) Appl. No.: 12/711,598

(22) Filed: Feb. 24, 2010

(65) Prior Publication Data

US 2010/0296291 A1    Nov. 25, 2010

(30) Foreign Application Priority Data

May 20, 2009   (KR) ......................... 10-2009-0044169

(51) Int. Cl.
| | |
|---|---|
| *H01S 3/10* | (2006.01) |
| *H01L 51/52* | (2006.01) |
| *B23K 26/06* | (2014.01) |
| *H01L 51/56* | (2006.01) |

(52) U.S. Cl.
CPC ........ *B23K 26/0656* (2013.01); *H01L 51/5237* (2013.01); *B23K 26/0639* (2013.01); *H01L 51/56* (2013.01)
USPC .............................. 372/20; 372/101; 372/103

(58) Field of Classification Search
USPC ............................................ 372/20, 101, 103
See application file for complete search history.

(56) References Cited

U.S. PATENT DOCUMENTS

| | | | | |
|---|---|---|---|---|
| 4,666,273 | A  * | 5/1987  | Shimizu et al. | ............... 353/101 |
| 5,969,799 | A  * | 10/1999 | Sano | ................. 355/53 |
| 6,998,776 | B2  | 2/2006  | Aitken et al. | |
| 7,344,901 | B2  | 3/2008  | Hawtof et al. | |
| 7,371,143 | B2  | 5/2008  | Becken et al. | |
| 7,537,504 | B2  | 5/2009  | Becken et al. | |
| 2004/0206953 | A1 | 10/2004 | Morena et al. | |
| 2005/0001545 | A1 | 1/2005  | Aitken et al. | |
| 2005/0068499 | A1 * | 3/2005  | Dodoc et al. | ...................... 353/10 |
| 2005/0116245 | A1 | 6/2005  | Aitken et al. | |
| 2006/0084348 | A1 * | 4/2006  | Becken et al. | ................... 445/25 |
| 2007/0128967 | A1 * | 6/2007  | Becken et al. | ................... 445/25 |
| 2008/0182062 | A1 | 7/2008  | Becken et al. | |
| 2010/0296291 | A1 * | 11/2010 | Kang | ............................ 362/259 |

FOREIGN PATENT DOCUMENTS

| | | |
|---|---|---|
| JP | 47-45657 A | 12/1972 |
| JP | 1-289588 A | 11/1989 |
| JP | 2006-524417 | 10/2006 |
| JP | 2008-055466 A | 3/2008 |

(Continued)

*Primary Examiner* — Kinam Park
(74) *Attorney, Agent, or Firm* — Robert E. Bushnell, Esq.

(57) ABSTRACT

A light radiating device capable of reducing production costs and preventing sealing defects for a display device, and a method of fabricating an organic light emitting diode (OLED) display device using the same are provided. The light radiating device includes a light source to generate light and a light modifier, including a transmissive region and a non-transmissive region, that define an exposure region on a substrate. The method includes applying a frit to at least one of a first substrate having a pixel region and a second substrate, plasticizing the frit, and aligning the first substrate, the second substrate, and a light radiating device to define an exposure region on the at least one of the first substrate and the second substrate, and radiating the light to the frit to couple the first substrate and the second substrate.

20 Claims, 5 Drawing Sheets

(56) References Cited

FOREIGN PATENT DOCUMENTS

| | | |
|---|---|---|
| JP | 2008-517446 | 5/2008 |
| JP | 2008-532207 A | 8/2008 |
| KR | 10-2006-0005369 | 1/2006 |
| KR | 10-2006-0011831 | 2/2006 |
| KR | 10-2006-0068680 | 6/2006 |
| KR | 1020060068677 A | 6/2006 |
| KR | 10-0671642 | 1/2007 |
| KR | 10-0848340 | 7/2008 |
| KR | 10-2008-0103842 | 11/2008 |
| WO | WO 2004/094331 | 11/2004 |
| WO | WO 2004/095597 | 11/2004 |
| WO | WO 2006/045067 | 4/2006 |

\* cited by examiner

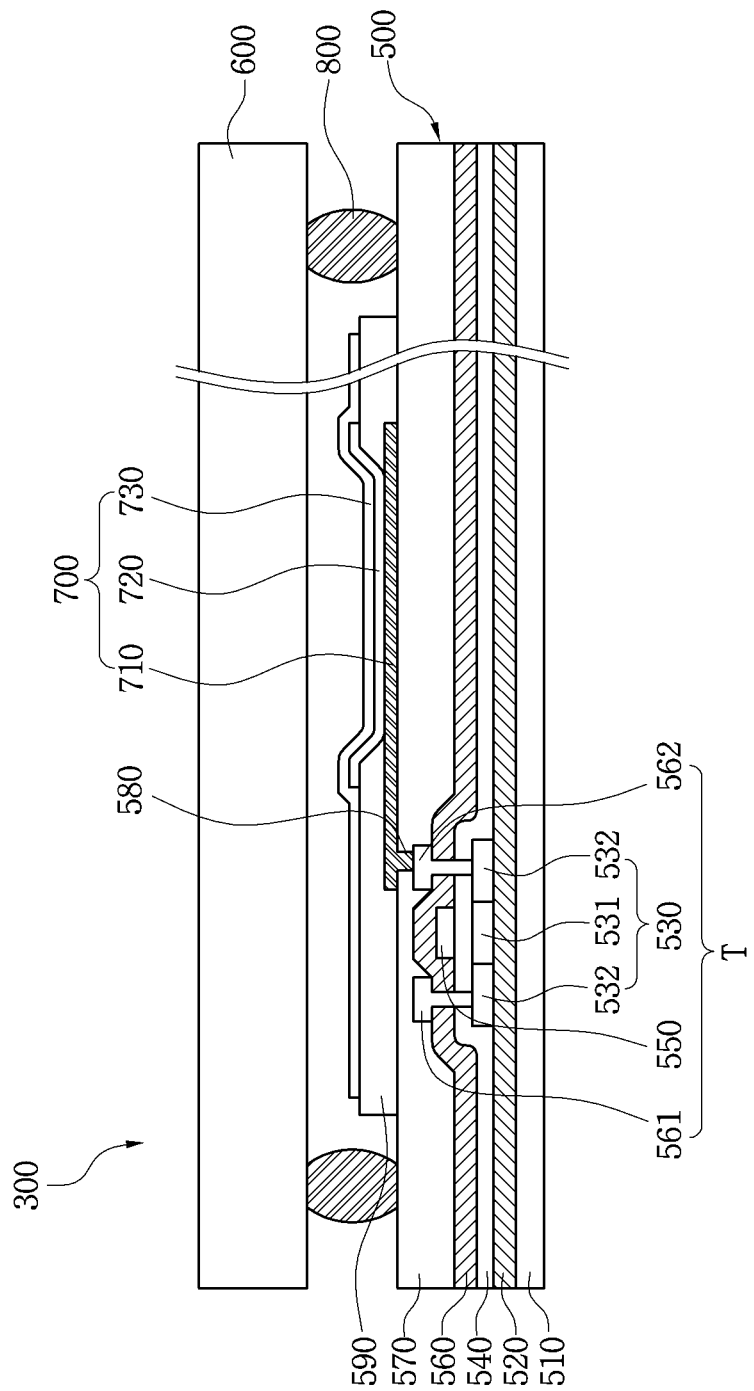

LIGHT RADIATING DEVICE AND METHOD OF FABRICATING ORGANIC LIGHT EMITTING DIODE DISPLAY DEVICE USING THE SAME

CROSS-REFERENCE TO RELATED APPLICATION

This application claims the benefit of Korean Patent Application No. 10-2009-0044169, filed May 20, 2009, in the Korean Intellectual Property Office, the disclosure of which is incorporated herein by reference.

BACKGROUND OF THE INVENTION

1. Field of the Invention

Aspects of the present invention relates to a light radiating device capable of reducing production costs and preventing sealing defects, and a method of fabricating an organic light emitting diode display device using the light radiating device.

2. Description of the Related Art

Recently, among flat panel display devices, an organic light emitting diode (OLED) display device, which uses an organic light emitting diode to display moving and still pictures, has attracted attention. The OLED display device is a display device that emits light by placing an organic compound having fluorescent characteristics between electrodes, the electrodes disposed to each other, and applying a voltage difference to the electrodes to electrically excite the organic compound. The OLED display device can be driven at a low voltage and thinly formed, and has advantages over current technology, such as a wide viewing angle and a fast response time.

The OLED display device includes a substrate having at least one organic light emitting diode, an encapsulation substrate coupled to the substrate to seal the organic light emitting diode, and a frit to couple the substrate to the encapsulation substrate.

To couple the substrate and the encapsulation substrate, the frit is formed as a paste and then applied at a predetermined thickness to at least one of the substrate and the encapsulation substrate. Subsequently, the frit applied to the substrate is pre-plasticized to remove moisture and/or a binder component. The encapsulation substrate is then aligned on the substrate, and the portion of the substrate on which the frit has been disposed is locally heated using a laser beam to melt the frit, resulting in a sealing process of coupling the substrate to the encapsulation substrate.

Here, to prevent damage to the region in which the organic light emitting diode is formed due to the laser, a mask is placed between the laser and the substrate. The mask exposes only the portion of the substrate on which the frit has been disposed, and thus has to have different patterns depending on the position of the frit applied to the substrate. For this reason, production costs may be increased. Further, when the mask is not appropriately equipped, or a contaminated mask is used, sealing defects may occur.

SUMMARY OF THE INVENTION

Aspects of the present invention provide a light radiating device including a light modifier as a mask. Other aspects of the present invention provide a method of fabricating an organic light emitting diode (OLED) display device which is capable of decreasing production costs due to replacing a mask and preventing sealing defects by performing sealing using the light radiating device.

According to an exemplary embodiment of the present invention, a light radiating device includes: a light source to generate light; and a light modifier. the light modifier including a transmissive region and a non-transmissive region, to define an exposure region on a subject.

According to another exemplary embodiment of the present invention, a method of fabricating an organic light emitting diode (OLED) display device, includes: applying a frit to at least one of a first substrate, the first substrate having a pixel region, and a second substrate to be coupled to the first substrate; plasticizing the frit; and aligning the first substrate, the second substrate, and a light radiating device, the light radiating device including a light modifier having a transmissive region and a non-transmissive region that define an exposure region of the generated light on the at least one of the first substrate and the second substrate, and radiating the light to the frit to couple the first substrate and the second substrate.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of exemplary embodiments, taken in conjunction with the accompanying drawings, of which:

FIG. 5 is a cross-sectional view of an exemplary organic light emitting diode (OLED) display device fabricated according to aspects of the present invention.

DETAILED DESCRIPTION OF THE EMBODIMENTS

Figure 1:
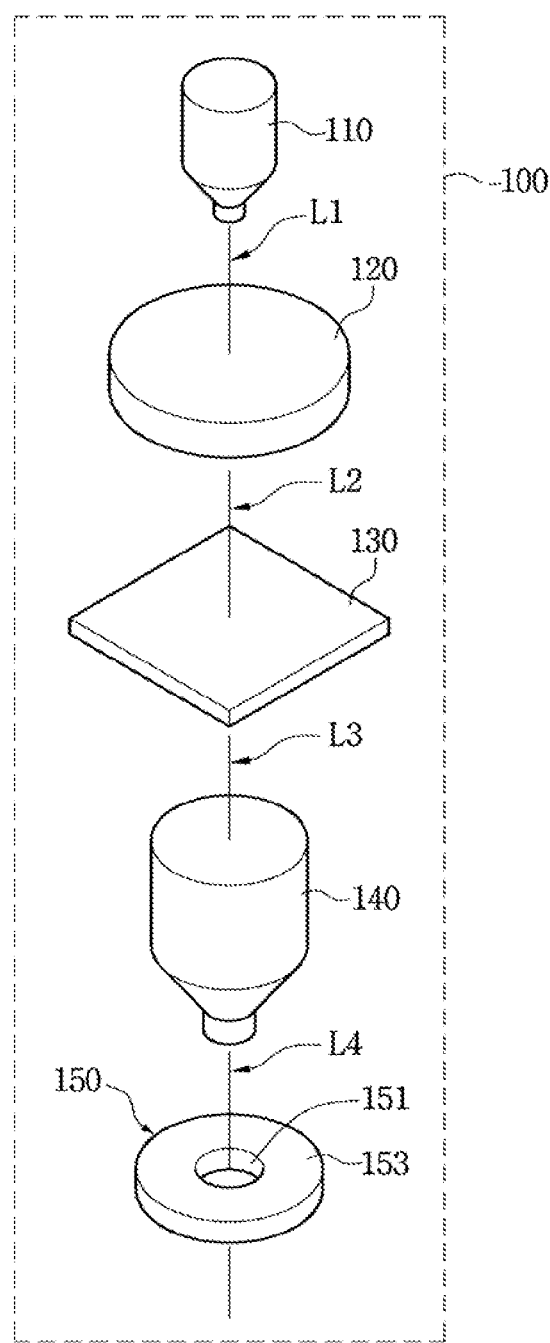
FIG. 1 is a schematic view of a light radiating device according to an exemplary embodiment of the present invention.

Reference will now be made in detail to exemplary embodiments of the present invention, examples of which are illustrated in the accompanying drawings, wherein like reference numerals refer to the like elements throughout. Exemplary embodiments are described below in order to explain the present invention by referring to the figures.

Hereinafter, a light radiating device and a method of fabricating an organic light emitting diode (OLED) display device according to exemplary embodiments will be described with reference to the accompanying drawings.

Figure 2A:
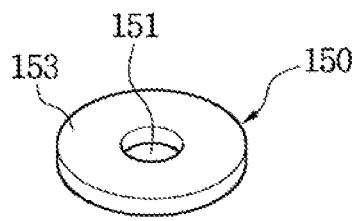
FIGS. 2A, 2A', 2B, 2B', 2C, 2C', and 3 are diagrams illustrating light modifiers included in the light radiating device according to exemplary embodiments of the present invention, respectively.
Figure 2A:
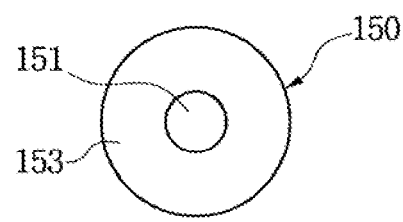
Figure 2B:
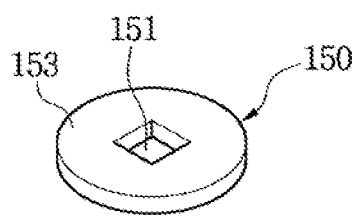
Figure 2B:
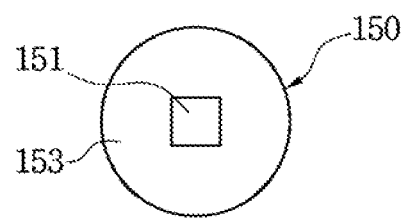
Figure 2C:
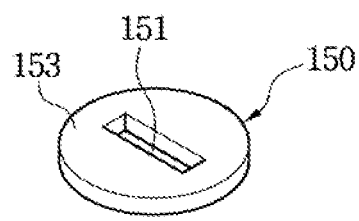
Figure 2C:
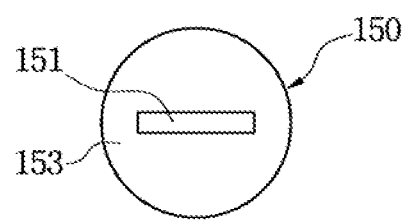
Figure 3:
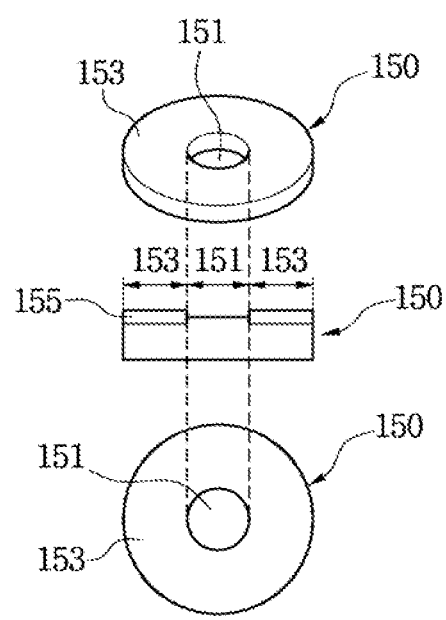

FIG. 1 is a schematic view of a light radiating device according to an exemplary embodiment, and FIGS. 2A to 3 are diagrams illustrating various figures of a light modifier included in the light radiating device according to exemplary embodiments, respectively.

Referring to FIG. 1, a light radiating device 100 includes a light source 110 to generate light, an image transformation device 120, a mask 130, a projection lens 140, and a light modifier 150. The light source 110 may be a laser, and the light generated from the light source 110 may be a laser beam. However, aspects are not limited thereto, and thus the light may vary depending on the light radiating device 100.

The image transformation device 120 is a device to transform the shape of an image of a light (L1) generated from the light source 110, and an image of light L2 passing through the image transformation device 120 may be homogenized and formed in a linear shape having a length in one direction. Such linear shape may include a rectangular shape having a relatively large aspect ratio as well as a literally linear shape but is not limited thereto. Further, an image refers to a region to which light is actually radiated when the light is radiated to a surface of a subject.

The light L2 having a linear image from the image transformation device 120 may pass through the mask 130. The mask 130 may have one or more light transmissive or reflective patterns. The light L2 having a linear image passes through the mask 130, thereby having an image patterned by the one or more light transmissive or reflective patterns. The one or more light transmissive or reflective patterns may be arranged in the linear image of the light L2 and may be arranged in a length direction of the light L2.

Light L3 having the image patterned by the mask 130 passes through the projection lens 140 to appropriately adjust a magnification and an intensity of the light L3, thereby having the magnification and intensity suitable for being radiated upon the surface of the subject (not shown). The projection lens 140 may be a simple or a compound lens and may be one or multiple lenses.

Light L4 having the magnification and intensity suitable for being radiated upon the surface of the subject passes through the light modifier 150. The light modifier 150 may be a mask. The light L4 is then radiated to the surface of the subject (not shown) placed under the light radiating device 100.

The light modifier 150 defines a light-transmission region on a subject, i.e., a light-exposure region, and includes a transmissive region 151 and a non-transmissive region 153. The light L4 is radiated upon a surface of the subject through the transmissive region 151. The position of the transmissive region 151 is not limited but may be placed in the middle of the light modifier 150. When the light generated from the light source 110 is radiated through the light modifier 150, it is transmitted only through the transmissive region 151 of the light modifier 150, such that the light transmitted through the light modifier 150 may be limited to the light transmitted through the transmissive region 151. The light transmitted through the transmissive region 151 thus defines the light-exposure region. As a result, precise exposure may be accomplished.

The light modifier 150 may be formed of a non-transparent or transparent material. If the non-transparent material is used, the light modifier 150 may be a metal material such as copper, stainless steel, and/or aluminum, but is not limited thereto. If the transparent material is used, the light modifier 150 may be formed of a material such as plastic, glass, and/or quartz, but the material of the light modifier 150 is not limited thereto.

Further, a cross-section of the light modifier 150 may have a circular, rectangular, or square shape, and as shown in FIG. 1, the cross-section of the light modifier 150 is a circular shape. Further, a cross-section of the transmission region 151 of the light modifier 150 may have a circular, rectangular, or square shape, and as shown in FIG. 1, the cross-section of the transmission region 151 of the light modifier 150 is a circular shape.

As shown in FIGS. 2A to 2C', if the light modifier 150 is formed of a non-transparent material, the transmissive region 151 may have the shape of a hole formed by removing a part of the light modifier 150, and the transmissive region 151 may be formed in a different shape, but is not limited to, for example, in a circular, square, or rectangular shape depending on the shape of the subject and the purpose of radiating light. For example, in FIGS. 2A and 2A', the transmissive region 151 of the light modifier 150 is shown as a circle. In FIGS. 2B and 2B', the transmissive region 151 of the light modifier 150 is shown as a square. In FIGS. 2C and 2C', the transmissive region 151 of the light modifier 150 is shown as a rectangle.

Alternatively, as shown in FIG. 3, if the light modifier 150 is formed of a transparent material, a shielding layer 155 may be further included on at least one of top and bottom surfaces of the light modifier 150 to reflect or absorb light. Thus, the shielding layer 155 is formed of a material that reflects and/or absorbs light.

The shielding layer 155 is disposed about the transmissive region 151 of the light modifier 150. That is, the shielding layer 155 may be formed to correspond to the non-transmissive region 153. For example, since light cannot pass through the portion in which the shielding layer 155 is formed but can pass through the portion in which the shielding layer 155 is not formed, the shape of the transmissive region 151 is defined by the shielding layer 155.

Similar to as shown in FIGS. 2A to 2C' with respect to the light modifier 150 formed of a nontransmissive material, the transmissive region 151 of the light modifier 150 formed of a transmissive material as shown in FIG. 3 may have various shapes, but are not limited to, for example, circular, square and rectangular shapes.

Referring back to FIG. 1, the light radiating device 100 according to an exemplary embodiment sequentially includes the light source 110, the image transformation device 120, the mask 130, the projection lens 140, and the light modifier 150. However, the image transformation device 120, the mask 130, and the projection lens 140, which are placed between the light source 110 and the light modifier 150, are optional elements, and other elements may be further included between the light source 110 and the light modifier 150 and may be disposed in alternative orders. Specifically, the elements disposed between the light source 110 and the light modifier 150 may be alternatively arranged according to the needs of those skilled in the art. That is, while various components may be alternatively arranged between the light source 110 and the light modifier 150, the light modifier 150 is disposed at an outermost portion of the light radiating device 110 such that the light generated from the light source 110 is finally radiated to the subject through the light modifier 150.

Figure 4A:
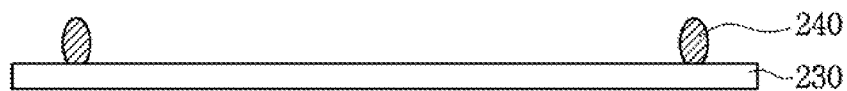
FIGS. 4A, 4A', and 4B are diagrams illustrating a method of fabricating an organic light emitting diode (OLED) display device.
Figure 4A:
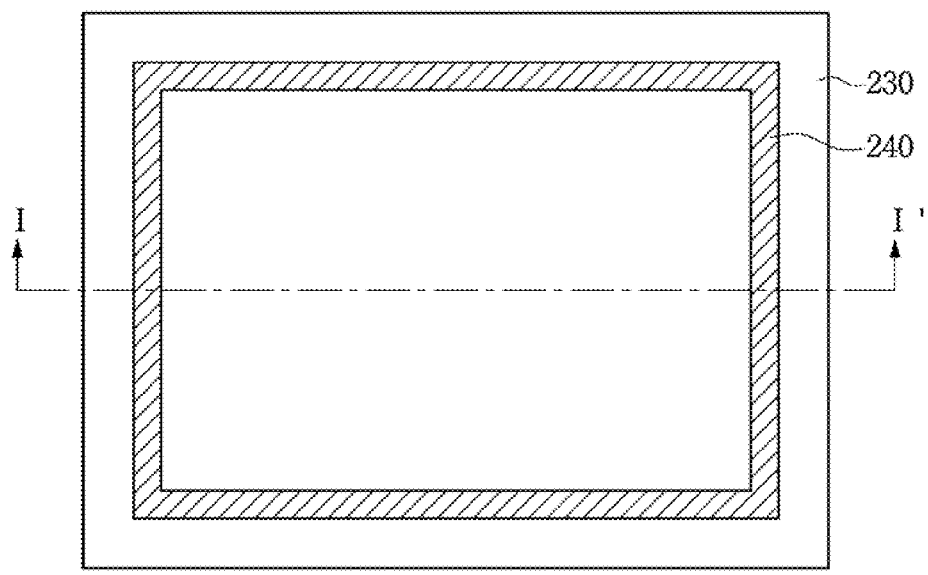

FIGS. 4A, 4A', and 4B are diagrams illustrating a method of fabricating an organic light emitting diode (OLED) display device. FIG. 4A is a cross-sectional view of a second substrate 230 along line I-I' of FIG. 4A'. Referring to FIGS. 4A, 4A', and 4B, a method of fabricating an OLED display device 200 includes preparing a first substrate 210 having a pixel region 220 in which one or more organic light emitting diodes are formed to display a predetermined image, and a second substrate 230 to be coupled to the first substrate 210 to seal the pixel region 220.

The first and second substrates 210 and 230 are adhered to each other by radiating light to a frit 240 disposed therebetween so that the pixel region 220 is sealed. To begin with, as shown in FIG. 4A, the frit 240, i.e., a glass powder having a low melting point, is formed in a paste form and then applied along an edge of the second substrate 230. The frit 240 is then plasticized at a predetermined temperature. Here, a process of plasticizing the frit 240 may be performed at a range from about 300 to about 700° C. in a furnace and may be performed with a laser. In some cases, the frit 240 may be applied to the first substrate 210, or to both the first and second substrates 210 and 230. That is, the frit 240 is applied to at least one of the first and second substrates 210 and 230.

The frit 240 may be applied by various methods, for example, screen-printing or dispensing, and an appropriate thickness of the frit 240 applied may be determined according to a final gap between the first substrate 210 and the second substrate 230. Before the plasticizing the frit 240 in the furnace, a process of drying the frit 240 may be further performed.

Figure 4B:
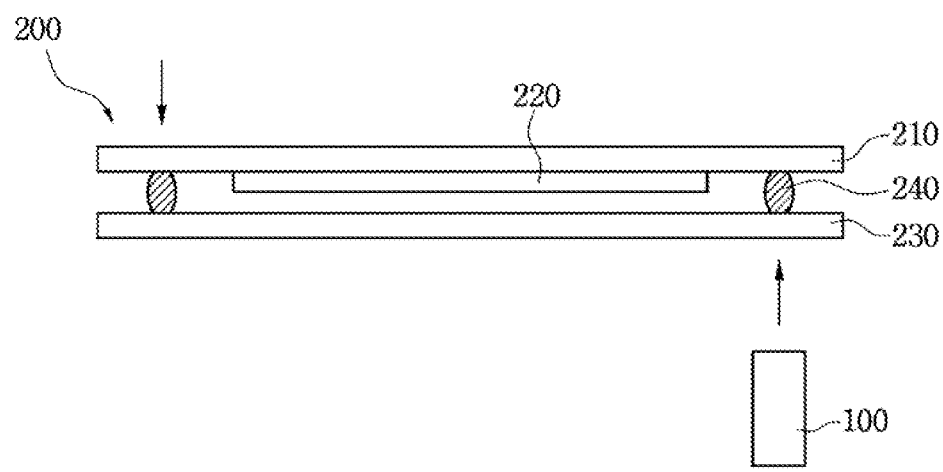

As shown in FIG. 4B, the first and second substrates 210 and 230 are aligned, and light is locally radiated from the light radiating device 100, according to aspects of the present invention, only to the portion having the frit 240 to couple the first substrate 210 to the second substrate 230, thereby completing a sealing process to seal the pixel region 220. In the present exemplary embodiment, light is radiated to the second substrate 230 from the light radiating device 100, but aspects are not limited thereto such that the light radiating device 100 may be disposed to radiate light to the first substrate 210 or to both the first and second substrates 210 and 230.

When the first and second substrates 210 and 230 are coupled to each other using the frit 240, the light source 110 of the light radiating device 100 may be a laser, and the light generated from the light source 110 may be a laser beam.

As shown in FIGS. 1 to 3, when the laser beam generated from the light source 110 of the light radiating device 100, i.e., the laser, is applied to the frit 240 through the light modifier 150, the laser beam is applied to the frit 240 only through the transmissive region 151 of the light modifier 150. Since the region through which the laser beam is transmitted can be limited to the transmissive region 151, damage to the pixel region 220, having the organic light emitting diode, due to the laser beam may be prevented by placing the transmissive region 151 of the light modifier 150 to correspond to the frit 240.

Thus, a mask which was disposed between light radiating devices and OLED display devices in conventional methods is no longer necessary, a production cost required to replace a mask may be saved, and sealing defects caused by an alignment error during installation of the mask and contamination of the mask may be prevented. Further, damage to the components placed above the mask due to reflection of radiated light upon a reflective layer of the mask due to a control error of equipment can be prevented.

FIG. 5 is a cross-sectional view of an exemplary OLED display device fabricated according to aspects of the present invention. Referring to FIG. 5, an OLED display device 300 includes a first substrate 500 having one or more organic light emitting diodes 700, and a second substrate 600 to be coupled to the first substrate 500 to seal the organic light emitting diode 700.

Further, a thin film transistor T may be formed on the first substrate 500 to control emission of the organic light emitting diode 700. Specifically, a buffer layer 520 is formed on a deposition substrate 510. The deposition substrate 510 is formed of glass, and the buffer layer 520 is formed of an insulating material such as silicon oxide ($SiO_2$) or silicon nitride ($SiN_x$). However, the buffer layer 520 need not be formed in all aspects.

A semiconductor layer 530, including a channel region 531 and source and drain regions 532, is formed on the buffer layer 520. A gate insulating layer 540 is formed on the semiconductor layer 530 and the buffer layer 520, and a gate electrode 550 is formed on the gate insulating layer 540 to correspond to the channel region 531, i.e., the gate electrode 550 is disposed on the gate insulating layer 540 above the channel region 531.

An interlayer insulating layer 560 is formed on the gate electrode 550 and the gate insulating layer 540, and portions of the gate insulating layer 540 and the interlayer insulating layer 560 are removed, thereby exposing portions of the source and drain regions 532. Source and drain electrodes 561 and 562 are formed in a region on the interlayer insulating layer 560, and are in contact with the exposed portions of the source and drain regions 532, respectively. A planarization layer 570 is formed on the source and drain electrodes 561 and 562 and the interlayer insulating layer 560.

A first electrode 710 is formed in a region of the planarization layer 570, and is in contact with one of the exposed regions of the source and drain electrodes 561 and 562 through a via hole 580 in the planarization layer 580.

A pixel defining layer 590 having an opening (not shown) to expose at least a portion of the first electrode 710 is formed on the first electrode 710 and the planarization layer 560. An organic layer 720 is formed on the opening of the pixel defining layer 590, and a second electrode 730 is formed on the organic layer 720 and the pixel defining layer 590.

The organic light emitting diode 700 includes the first electrode 710, the organic layer 720 and the second electrode 730, and the thin film transistor T includes the semiconductor layer 530, the gate electrode 550 and the source and drain electrodes 561 and 562.

The second substrate 600 is coupled to the first substrate 500 using a frit 800 to protect the predetermined structure formed on the first substrate 500 from the air, including oxygen, hydrogen, and moisture.

According to the configuration described above, although there is no mask disposed between a light radiating device and an OLED display device, damage to a pixel region 220, having an organic light emitting diode, due to a laser beam can be prevented. Thus, production costs required to replace a mask can be saved by removing the mask, and sealing defects caused by an alignment error during installation of the mask and contamination of the mask can be prevented. Further, damage to components placed over the mask caused by reflection of light radiated upon a reflective layer on the mask due to a control error of equipment can be prevented.

Although a few embodiments have been shown and described, it would be appreciated by those skilled in the art that changes may be made in this embodiment without departing from the principles and spirit of the invention, the scope of which is defined in the claims and their equivalents.

What is claimed is:

1. An apparatus for sealing a pixel region of an organic light emitting device, comprising:
    a light radiating device, comprising:
        a light source to generate light; and
        a light modifier, the light modifier including a transmissive region and a non-transmissive region, the light modifier being placed at an outermost portion of the light radiating device, the light modifier comprising an opening, the opening defining an exposure region on an organic light emitting device to be sealed,
        the light source and the light modifier having positions that are fixed relative to each other and having a fixed orientation relative to each other,
        the light radiating device being moveable in relation to the organic light emitting device,
        the light generated by the light source passing through the light modifier and not being further occluded before striking the organic light emitting device.

2. The apparatus according to claim 1, the light modifier being formed of a non-transparent material.

3. The apparatus according to claim 1, the light modifier being formed of a transparent material.

4. The apparatus according to claim 2, the non-transparent material including metal.

5. The apparatus according to claim 4, the metal including any one of copper, stainless steel, aluminum and combinations thereof.

6. The apparatus according to claim 3, the transparent material including any one of plastic, glass, quartz and combinations thereof.

7. The apparatus according to claim 3, further comprising a shielding layer formed on at least one of top and bottom surfaces of the light modifier, and aligned with the non-transmissive region.

8. The apparatus according to claim 7, the shielding layer being formed of a material that reflects or absorbs the light from the light source.

9. The apparatus according to claim 1, the transmissive region being one of circular, square and rectangular.

10. The apparatus according to claim 1, further comprising an image transformation device to transform a shape of an image of the light generated from the light source, a mask to pattern the light, and one or more projection lenses to adjust the magnification and intensity of the light, each disposed between the light source and the light modifier.

11. The apparatus according to claim 10, the image transformation device, the mask, and the projection lens being sequentially arranged between the light source and the light modifier.

12. The apparatus according to claim 11, the image transformation device being disposed adjacent to the light source.

13. The apparatus according to claim 10, the image transformation device transforming the light to be homogeneous.

14. The apparatus according to claim 10, the mask including at least one light transmissive or reflective patterns.

15. The apparatus according to claim 1, the light radiating device radiating the light to a frit disposed between a first substrate having a pixel region and a second substrate to adhere the first and second substrates to each other.

16. The apparatus according to claim 15, the light source being laser, and the light being a laser beam.

17. The apparatus according to claim 1, the light source being laser, and the light being a laser beam.

18. A light radiating device, comprising:
a light source to generate light;
an image transformation device to homogenize an image of the generated light and form the image into a linear shape having a length in one direction;
a mask that has one or more transmissive or reflective patterns and patterns the image;
at least one projection lens that adjusts a magnification and an intensity of the light that forms the image; and
a light modifier comprising an opening, the opening defining a light exposure region on a subject, the light modifier comprising at least one of a non-transparent material and a shielding layer.

19. The light radiating device of claim 18, the light modifier further comprising a transmissive region and a non-transmissive region, which define the exposure region on the subject.

20. The light radiating device of claim 18, the at least one projection lens being a simple or compound lens.

* * * * *